United States Patent
Sakuragi (10) Patent No.: US 10,764,524 B2
(45) Date of Patent: Sep. 1, 2020

(54) IMAGING APPARATUS, METHOD OF DRIVING IMAGING APPARATUS, AND APPARATUS USING THE IMAGING APPARATUS

(71) Applicant: CANON KABUSHIKI KAISHA, Tokyo (JP)

(72) Inventor: Takamasa Sakuragi, Machida (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 177 days.

(21) Appl. No.: 15/901,807

(22) Filed: Feb. 21, 2018

(65) Prior Publication Data
US 2018/0184033 A1 Jun. 28, 2018

Related U.S. Application Data

(63) Continuation of application No. 14/700,332, filed on Apr. 30, 2015, now Pat. No. 9,986,190.

(30) Foreign Application Priority Data

May 8, 2014 (JP) .................................. 2014-096530

(51) Int. Cl.
*H01L 27/00* (2006.01)
*H04N 5/378* (2011.01)
(Continued)

(52) U.S. Cl.
CPC ....... *H04N 5/378* (2013.01); *H01L 27/14612* (2013.01); *H01L 27/14643* (2013.01); *H04N 5/3741* (2013.01); *H04N 5/37457* (2013.01)

(58) Field of Classification Search
CPC .. H04N 5/37457; H04N 5/3741; H04N 5/378; H01L 27/14643; H01L 27/14612
(Continued)

(56) References Cited

U.S. PATENT DOCUMENTS 7,023,482 B2 4/2006 Sakuragi
7,443,237 B1 * 10/2008 Liu .................... H03F 3/45192
330/253
(Continued)

FOREIGN PATENT DOCUMENTS

JP 2003-228427 4/2003
JP 2003-228427 8/2003
(Continued)

OTHER PUBLICATIONS

Japanese Office Action dated Mar. 8, 2018 in Japanese Application No. 2014096530, with machine-generated translation.
(Continued)

*Primary Examiner* — Georgia Y Epps
*Assistant Examiner* — Kevin Wyatt
(74) *Attorney, Agent, or Firm* — Venable LLP (57) ABSTRACT

Provided is an imaging apparatus, including: a photoelectric conversion element; an amplifier transistor configured to output a voltage corresponding to electric charges generated by the photoelectric conversion element; a load transistor configured to supply a bias current to the amplifier transistor; and a voltage supply unit configured to input one of a first voltage and a second voltage, which have different voltage values, to a control node of the load transistor via an input capacitor. In the imaging apparatus, a current value of the bias current to be supplied by the load transistor at a time when the second voltage is input to the control node via the input capacitor is larger than a current value of the bias current to be supplied by the load transistor at a time when the first voltage is input to the control node via the input capacitor.

8 Claims, 12 Drawing Sheets

(51) Int. Cl.
*H04N 5/3745* (2011.01)
*H04N 5/374* (2011.01)
*H01L 27/146* (2006.01)

(58) Field of Classification Search
USPC ..................................................... 250/208.1
See application file for complete search history.

(56) References Cited

U.S. PATENT DOCUMENTS

| | | |
|---|---|---|
| 7,999,875 B2 | 8/2011 | Toya et al. |
| 8,269,873 B2 | 9/2012 | Koseki et al. |
| 8,278,613 B2 | 10/2012 | Okita et al. |
| 8,314,873 B2 | 11/2012 | Border et al. |
| 8,638,384 B2 | 1/2014 | Sakuragi |
| 8,884,864 B2 | 11/2014 | Sakuragi |
| 2008/0210848 A1 | 9/2008 | Purcell |
| 2012/0043454 A1 | 2/2012 | Sakuragi |
| 2012/0056251 A1 | 3/2012 | Kudoh |
| 2012/0092536 A1* | 4/2012 | Hirota ............... H01L 27/14645 348/294 |
| 2013/0235240 A1 | 9/2013 | Yoshida |
| 2014/0333811 A1* | 11/2014 | Zhang .................. H04N 5/3745 348/300 |
| 2015/0109504 A1 | 4/2015 | Sakuragi |
| 2015/0109505 A1 | 4/2015 | Sakuragi |
| 2016/0006969 A1* | 1/2016 | Matsumoto .......... H04N 5/3575 348/308 |
| 2016/0014356 A1 | 1/2016 | Sakuragi |

FOREIGN PATENT DOCUMENTS

| | | |
|---|---|---|
| JP | 2006-186467 A | 7/2006 |
| JP | 2010-28320 | 2/2010 |
| JP | 2010-028320 A | 2/2010 |

OTHER PUBLICATIONS

Japanese office action dated Mar. 8, 2018 in Japanese Application No. 2014-096530 (with whole English Translation).
Japanese Office Action issued during prosecution of related Japanese application No. 2014-096530.

* cited by examiner

IMAGING APPARATUS, METHOD OF DRIVING IMAGING APPARATUS, AND APPARATUS USING THE IMAGING APPARATUS

This application is a continuation of application Ser. No. 14/700,332, filed Apr. 30, 2015, the contents of which are incorporated herein.

BACKGROUND OF THE INVENTION

Field of the Invention

The present invention relates to an imaging apparatus, a method of driving an imaging apparatus, and an apparatus using the imaging apparatus.

Description of the Related Art

Imaging apparatus, such as a CMOS image sensor, are required to improve the operation speed of reading a pixel signal by a read circuit. In the Japanese Patent Application Laid-Open No. 2010-28320, it is described that a bias current of a transistor configured to amplify the signal voltage of a pixel is increased for a given period, thereby being capable of reading the pixel signal at a higher speed. In the Japanese Patent Application Laid-Open No. 2006-186467, it is described that a read current source portion is configured to supply a normal reading current and also temporarily supply an additional reading current, thereby being capable of reducing a read-out time.

In the Japanese Patent Application Laid-Open No. 2010-28320, as a method of increasing the bias current, a switch (transistor) of a constant current circuit configured to supply the bias current to the amplifier transistor is operated to change the current. Such a current path involves a parasitic capacitance, and hence a charge current for charging the parasitic capacitance is necessary at the time of the switching. In other words, a part of the current increased by the switching is used as the charge current. Accordingly, it takes a longer time for an output voltage of the amplifier transistor to change, resulting in a longer settling time. Thus, there is a problem in that the pixel signal voltage is unstably read at a lower speed.

In the readout method disclosed in the Japanese Patent Application Laid-Open No. 2006-186467, a load control signal is controlled to increase an operating current for a given period of time. Switching noise is generated when the load control signal is switched, resulting in a longer settling time of an output signal voltage. Thus, there is a problem in that the pixel signal voltage is unstably read at a lower speed.

SUMMARY OF THE INVENTION

According to one embodiment of the present invention, there is provided an imaging apparatus, including: a photoelectric conversion element; an amplifier transistor configured to output a voltage corresponding to electric charges generated by the photoelectric conversion element; a load transistor configured to supply a bias current to the amplifier transistor; and a voltage supply unit configured to input one of a first voltage and a second voltage, which have different voltage values, to a control node of the load transistor via an input capacitor, in which a current value of the bias current to be supplied by the load transistor at a time when the second voltage is input to the control node via the input capacitor is larger than a current value of the bias current to be supplied by the load transistor at a time when the first voltage is input to the control node via the input capacitor.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings. Throughout the drawings, the same members are denoted by the same reference symbols, and descriptions thereof are sometimes omitted.

First Embodiment

Figure 1:
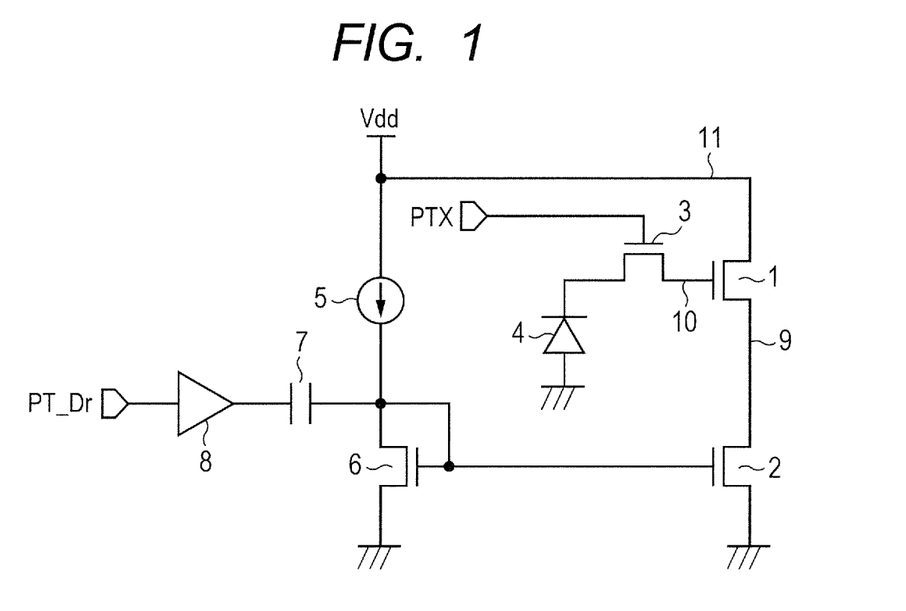
FIG. 1 is a circuit diagram of an imaging apparatus according to a first embodiment of the present invention.

FIG. 1 is a circuit diagram of an imaging apparatus according to a first embodiment of the present invention. The imaging apparatus includes a plurality of pixels arranged in line or in array. In FIG. 1, one pixel and one signal readout circuit are exemplified for simple illustration. The imaging apparatus includes an amplifier transistor 1, a load transistor 2, a transfer transistor 3, a photoelectric conversion element 4, a current source 5, a current mirror transistor 6, an input capacitor 7, a voltage driver 8 (voltage supply unit), a vertical signal line 9, and power supply interconnect 11. Each transistor is an N-type or P-type MOS transistor. This embodiment assumes that each transistor is an N-type MOS transistor. Specifically, each transistor is turned on (conductive state) when a voltage of High level is input to a gate (control node) thereof, and turned off (non-conductive state) when a voltage of Low level is input thereto.

The photoelectric conversion element 4 is an optical sensor element, such as a photodiode, for generating electric charges corresponding to the amount of incident light through photoelectric conversion to accumulate the electric charges. A source of the transfer transistor 3 is connected to the photoelectric conversion element 4, and a drain thereof is connected to a gate of the amplifier transistor 1. When a control signal PTX input to agate of the transfer transistor 3 becomes High level, electric charges accumulated in the photoelectric conversion element 4 are transferred to a floating diffusion 10, which is an input node of the amplifier transistor 1. A power supply voltage Vdd is supplied to a drain of the amplifier transistor 1 from the power supply interconnect 11. A source of the amplifier transistor 1 is connected to a drain of the load transistor 2 through the vertical signal line 9. In other words, the amplifier transistor 1 forms a source follower circuit, and a voltage corresponding to the electric charges transferred from the photoelectric conversion element 4 to the floating diffusion 10 is output to the vertical signal line 9. When the electric charges generated by the photoelectric conversion element 4 are regarded as electrons, electrons having negative electric charges are transferred to the floating diffusion 10, and hence the voltage output to the vertical signal line 9 drops. The slew rate in this case depends on a current flowing between the drain and source of the load transistor 2, and depends on a parasitic capacitance attached between the vertical signal line 9 and the ground and between the vertical signal line 9 and another interconnect.

A gate of the current mirror transistor 6 is connected to a drain thereof, and also connected to a gate of the load transistor 2. A current is supplied to the drain of the current mirror transistor 6 from the current source 5. Sources of the current mirror transistor 6 and the load transistor 2 are grounded. The current mirror transistor 6 and the load transistor 2 form a current mirror circuit. Thus, a current corresponding to a current flowing between the drain and the source of the current mirror transistor 6 flows also between the drain and the source of the load transistor 2. Because the drain of the load transistor 2 is connected to the source of the amplifier transistor 1 as described above, the current supplied from the current mirror circuit serves as a bias current for the amplifier transistor 1.

The voltage driver 8 is a circuit for outputting a voltage obtained by amplifying or buffering an input control signal PT_Dr. An output terminal of the voltage driver 8 is connected to the drain of the current mirror transistor 6 via the input capacitor 7. The input capacitor 7 and an on-resistance of the current mirror transistor 6 form a differentiator circuit. In other words, only a high frequency component of the output voltage of the voltage driver 8 is input to the current mirror transistor 6. Note that, the on-resistance is the reciprocal of gm (1/gm), where gm represents the transconductance of the current mirror transistor 6.

Figure 2:
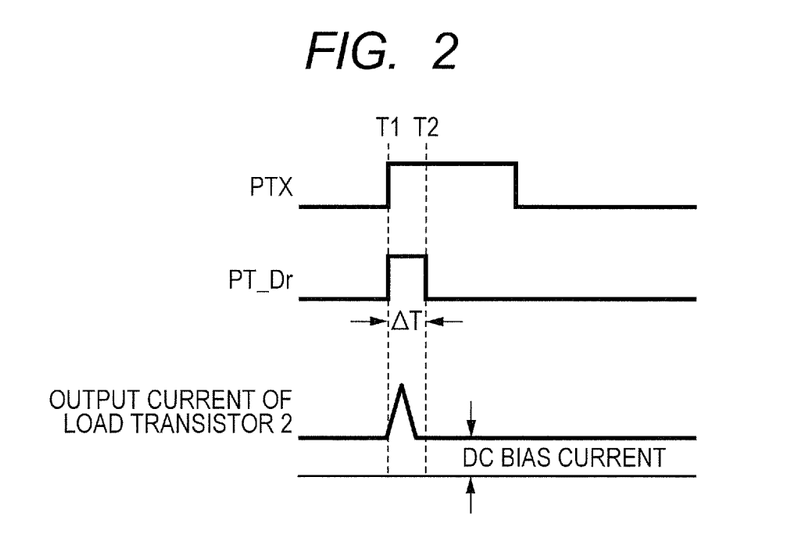
FIG. 2 is a timing chart of the imaging apparatus according to the first embodiment of the present invention.

FIG. 2 is a timing chart illustrating an operation of the imaging apparatus according to the first embodiment of the present invention. The timing chart illustrates a relationship between the control signals PTX and PT_Dr and the current flowing through the load transistor 2. The control signal PT_Dr is a pulse signal whose voltage value becomes High level in the period from a time T1 to a time T2 and becomes Low level in other periods.

In the period before the time T1, the control signal PTX is at Low level. In this case, the transfer transistor 3 is turned off. Further, the control signal PT_Dr is at Low level, and hence the voltage of Low level is input to the voltage driver 8. The voltage to be supplied to the control node of the load transistor 2 by the voltage driver 8 in this case is referred to as "first voltage".

At the time T1, the control signal PTX becomes High level. Accordingly, the transfer transistor 3 is turned on, and an electrical path between the photoelectric conversion element 4 and the amplifier transistor 1 gets in the conductive state. Further, at the same time, the control signal PT_Dr also becomes High level. Accordingly, the voltage of High level is input to the voltage driver 8. The voltage to be supplied to the control node of the load transistor 2 by the voltage driver 8 in this case is referred to as "second voltage". The second voltage is larger in amplitude than the first voltage.

At the time T2 after a predetermined period (this period is represented by "ΔT") has elapsed since the transfer transistor 3 was turned on, the control signal PT_Dr becomes Low level. Accordingly, the voltage to be supplied to the control node of the load transistor 2 by the voltage driver 8 becomes the first voltage again. After that, the control signal PTX becomes Low level, and the transfer transistor 3 is turned off again. In other words, in the period from the time T2 until the control signal PTX becomes Low level, the voltage to be supplied to the control node of the load transistor 2 by the voltage driver 8 becomes the first voltage.

As described above, the input capacitor 7 and the on-resistance of the current mirror transistor 6 form the differentiator circuit, and the current mirror transistor 6 and the load transistor 2 form the current mirror circuit. Thus, around the timing at which the value of the control signal PT_Dr changes from Low level to High level, a current having a peak similar to a triangular wave flows through the load transistor 2, and the current value thereof is increased. In other periods, a constant DC bias current flows through the load transistor 2. As a result, in the period ΔT from the time T1 at which the control signal PT_Dr becomes High level to the time T2 at which the control signal PT_Dr returns to Low level, the load transistor 2 may cause a large amount of current to flow, thereby being capable of rapidly decreasing the voltage of the vertical signal line 9.

Figure 3A:
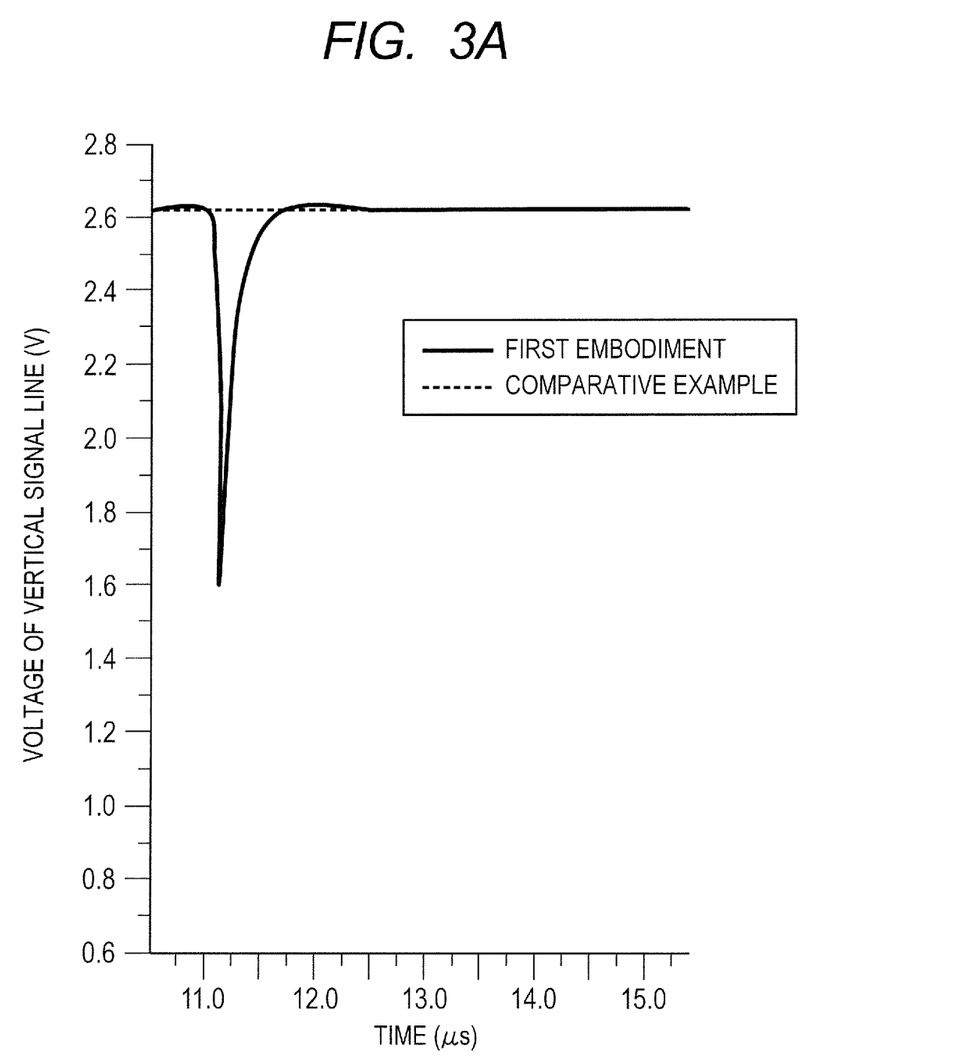
FIG. 3A is a graph of a simulation result showing an effect of the first embodiment of the present invention.
Figure 3B:
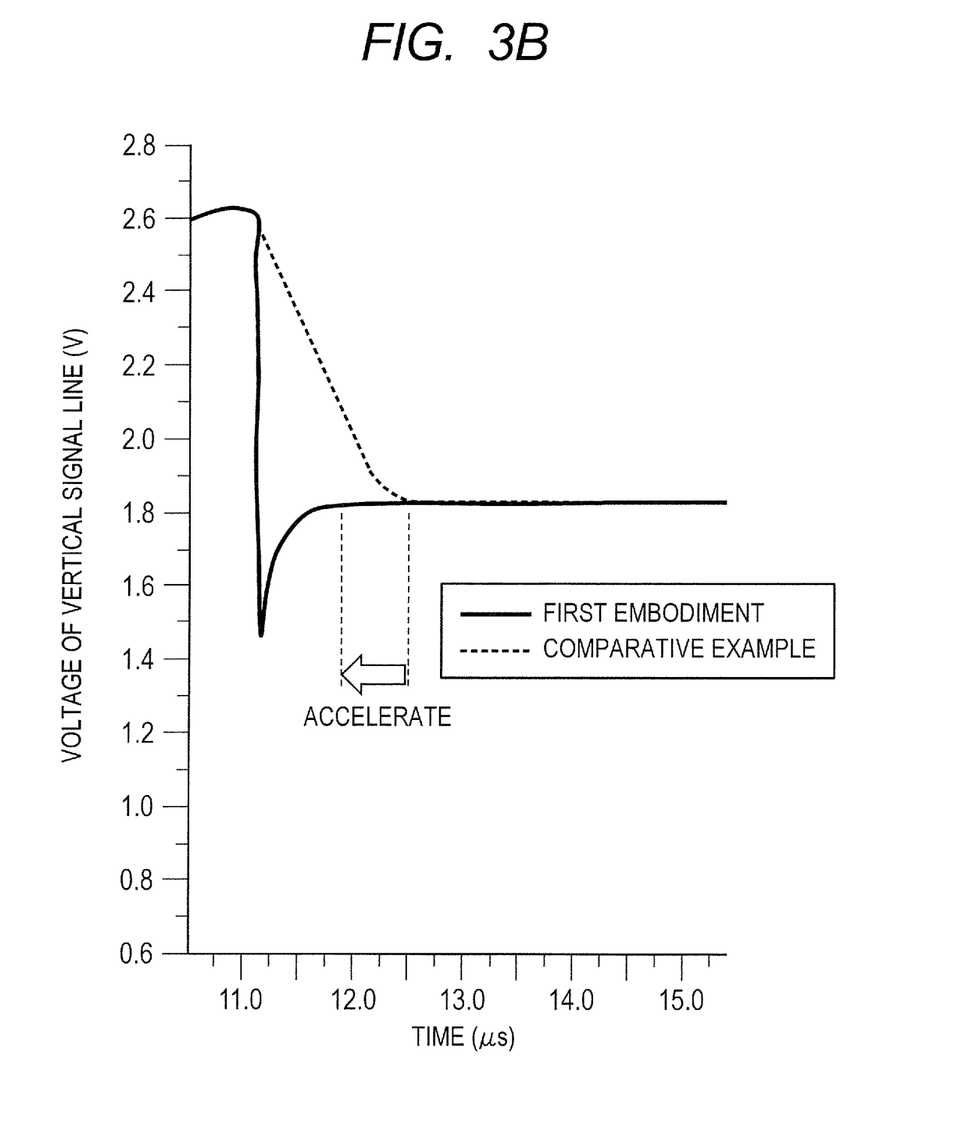
FIG. 3B is a graph of a simulation result showing the effect of the first embodiment of the present invention.
Figure 3C:
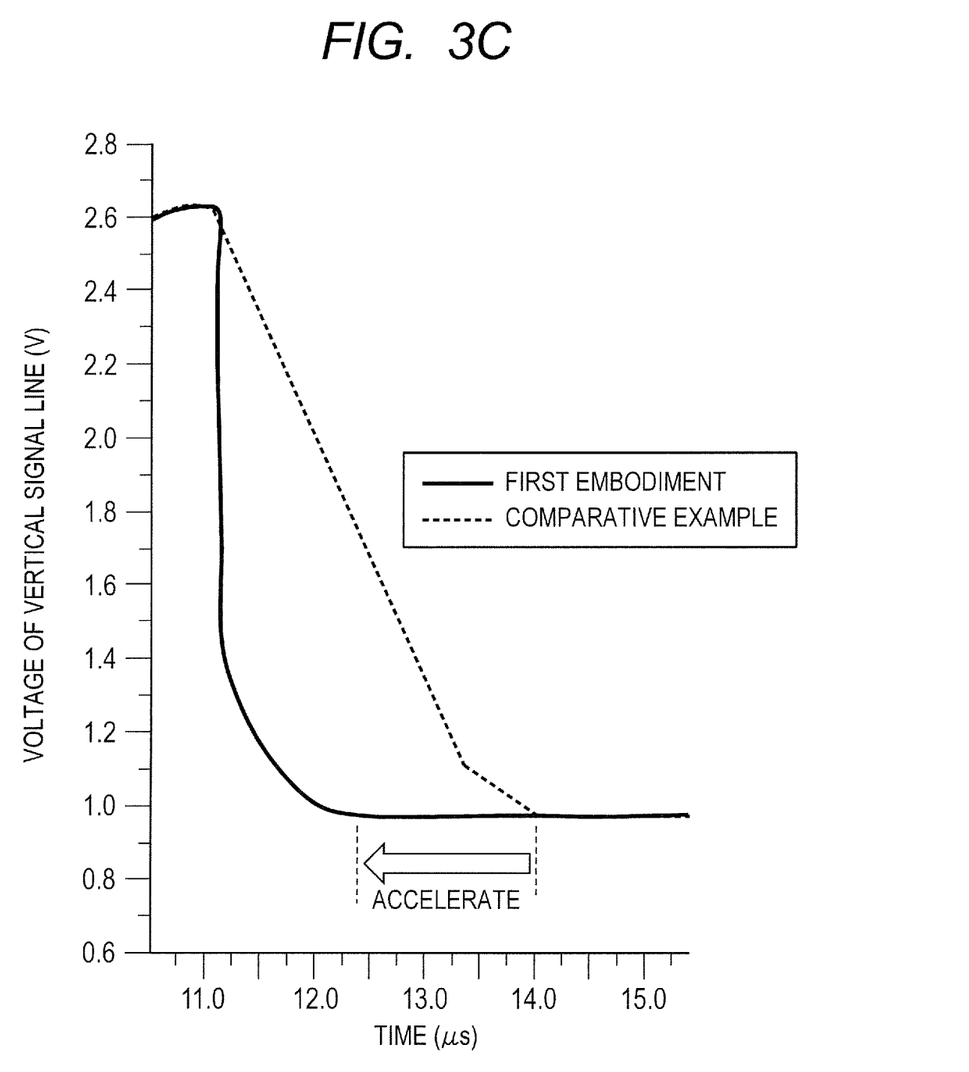
FIG. 3C is a graph of a simulation result showing the effect of the first embodiment of the present invention.

FIGS. 3A, 3B, and 3C are graphs of simulation results of the voltage of the vertical signal line 9 in the circuit according to the first embodiment of the present invention. Each of FIGS. 3A, 3B, and 3C shows voltage fluctuations (solid line) in the vertical signal line 9 according to this embodiment and voltage fluctuations (broken line) in a configuration without the voltage driver 8 and the input capacitor 7 according to a comparative example of this embodiment. Further, FIG. 3A shows the case (a) where the amount of pixel signal electric charges accumulated in the photoelectric conversion element is zero, FIG. 3B shows the case (b) where the amount of pixel signal electric charges is small, and FIG. 3C shows the case (c) where the amount of pixel signal electric charges is large. In particular, with reference to the result of the case (c) of FIG. 3C where the amount of pixel signal electric charges is large, it is understood that the voltage in the vertical signal line 9 in this embodiment has settled earlier by about 2 μs as compared to the comparative example, resulting in a shorter settling time.

Further, with reference to the case (b) of FIG. 3B where the amount of pixel signal electric charges is small, the settling time reduction effect is similarly obtained although the difference from the comparative example is about 1 µs and the effect is smaller than that in the case (c). From the above, it is understood that the effect of this embodiment is high particularly when the amount of pixel signal electric charges is large as exemplified by the cases (b) and (c). The reason is that in the configuration of the comparative example, the amount of voltage drop in the vertical signal line 9 becomes larger as the amount of pixel signal electric charges becomes larger, resulting in a longer settling time. Note that, in the case (a) of FIG. 3A where the amount of pixel signal electric charges is zero, the electric charges are not transferred to the floating diffusion 10, and hence almost no voltage fluctuations occur in the comparative example but voltage undershoot occurs in this embodiment. This phenomenon is described later.

Figure 4:
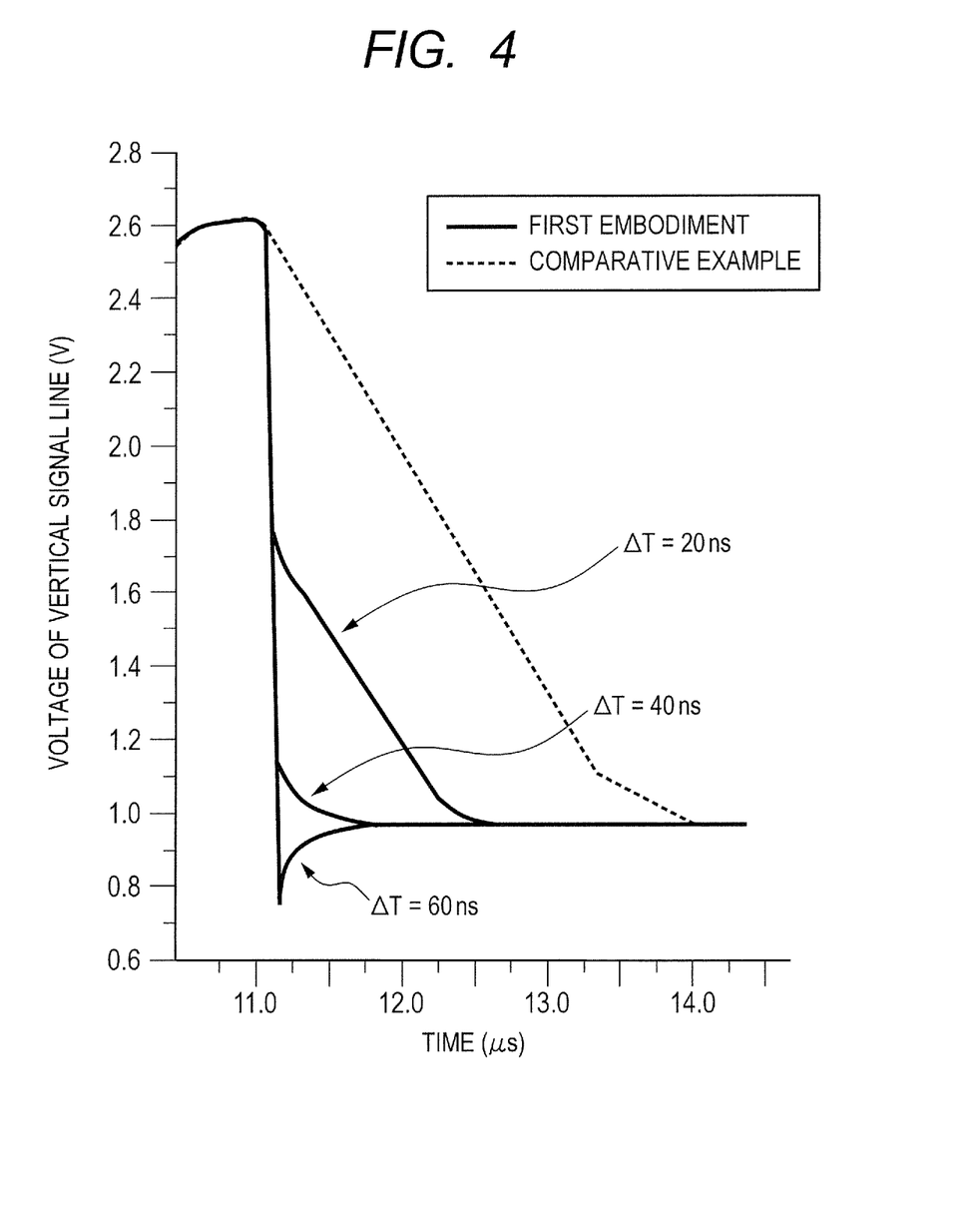
FIG. 4 is a graph of a simulation result showing that the effect of the first embodiment of the present invention depends on a voltage pulse width.

FIG. 4 is a graph of simulation results showing that the settling time depends on a voltage pulse width of the control signal PT_Dr according to the first embodiment of the present invention. In FIG. 4, a total of four cases, the case of the above-mentioned comparative example and the cases of this embodiment in which the period ΔT is set to 20 ns, 40 ns, and 60 ns, are compared. From FIG. 4, it is understood that, as the period ΔT becomes larger, the settling time becomes shorter due to the increased effect of helping the vertical signal line 9 to change its voltage. Consequently, according to the results of FIGS. 3A, 3B, and 3C and FIG. 4, when the period ΔT is set to be longer as the amount of voltage change in the vertical signal line 9 becomes larger, a higher effect of accelerating the voltage change in this embodiment is exerted.

As described above, according to the imaging apparatus in this embodiment, the pixel signal voltage may be read stably at a higher speed. The imaging apparatus according to this embodiment is applicable to an imaging system, such as a camera. When the brightness of an imaging target is low, the camera generally operates so as to set a higher ISO speed value. Thus, it is preferred to increase the period ΔT depending on the magnitude of the ISO speed value set in the camera. Further, because the amount of change in output current of the load transistor 2 may be increased as the voltage difference between the outputs of the voltage driver 8 at High level and at Low level becomes larger, it is also preferred to set the voltage difference to be large when the ISO speed value is set large.

Second Embodiment

Figure 5:
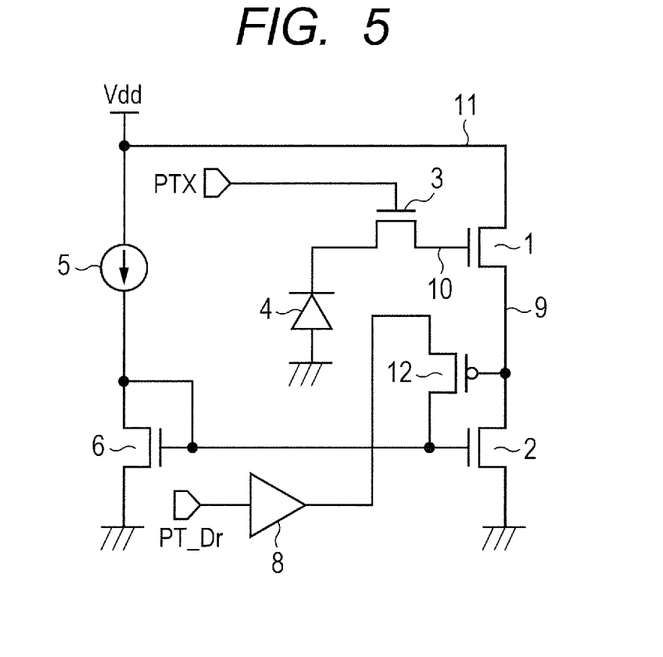
FIG. 5 is a circuit diagram of an imaging apparatus according to a second embodiment of the present invention.

FIG. 5 is a circuit diagram of an imaging apparatus according to a second embodiment of the present invention. The difference from the circuit diagram of the first embodiment illustrated in FIG. 1 resides in that the input capacitor 7 is removed and an input transistor 12 formed of a PMOS transistor is added. A gate (control node) of the input transistor 12 is connected to the vertical signal line 9, a drain (first main node) thereof is connected to the gate of the load transistor 2, and a source (second main node) thereof is connected to the output terminal of the voltage driver 8.

Reference is made again to FIGS. 3A to 3C showing the simulation results according to the first embodiment. Particularly in the case (a) of FIG. 3A where the amount of pixel signal electric charges is zero, the undershoot occurs because the voltage of the vertical signal line 9 drops once due to the influence of the output current of the load transistor 2. The undershoot may be an obstacle to high-speed reading of the voltage of the vertical signal line 9. This embodiment is configured so as to suppress the undershoot.

Figure 6:
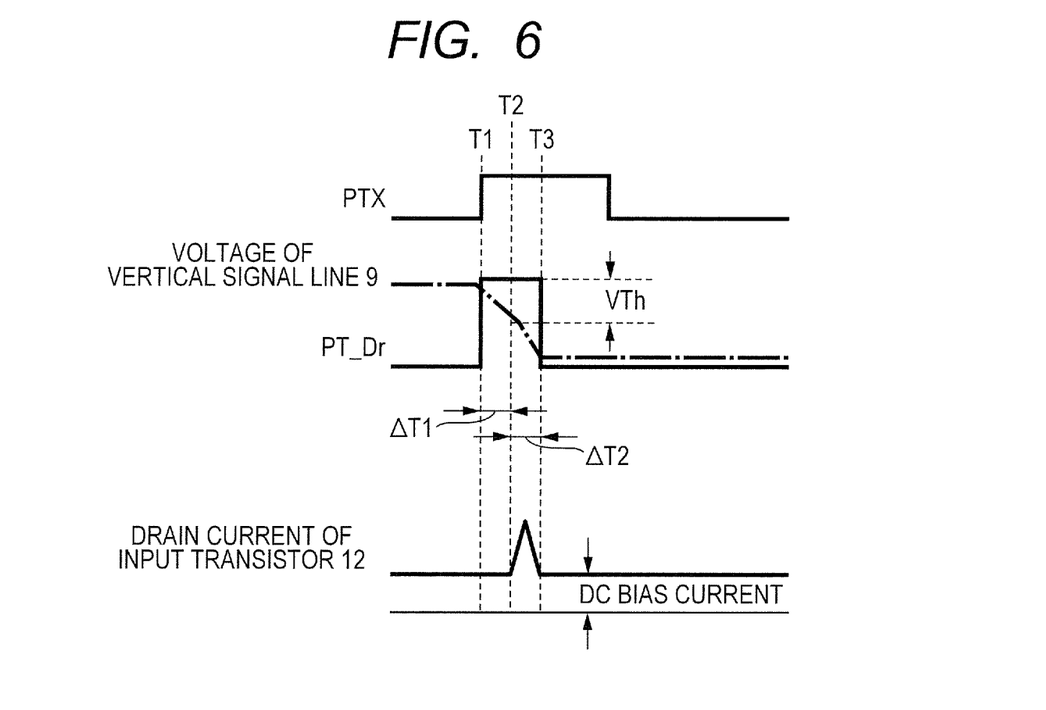
FIG. 6 is a timing chart of the imaging apparatus according to the second embodiment of the present invention.

FIG. 6 is a timing chart illustrating an operation of the imaging apparatus according to the second embodiment of the present invention. After signal electric charges are accumulated in the photoelectric conversion element 4, at a time T1, the control signal PTX becomes High level, and the transfer transistor 3 is turned on. In this case, the gate voltage of the amplifier transistor 1 drops, and along therewith, the voltage of the vertical signal line 9 also gradually drops due to the output current of the load transistor 2 as indicated by the dashed line (period ΔT1 between T1 and T2). Further, the control signal PT_Dr also becomes High level, and the output voltage of High level is input from the voltage driver 8 to the source of the input transistor 12.

When a difference between the voltage of the vertical signal line 9 and the output voltage of High level of the voltage driver 8 reaches a threshold voltage VTh of the input transistor 12 or higher, the input transistor 12 is turned on (this time is represented by "T2"). Accordingly, a drain current of the input transistor 12 is applied to the gate of the load transistor 2, and the output current of the load transistor 2 quickly increases, with the result that the voltage of the vertical signal line 9 drops (period ΔT2 between T2 and T3). On the other hand, in the case where the amount of signal electric charges transferred from the photoelectric conversion element 4 is zero, no voltage drop occurs in the vertical signal line 9, and the input transistor 12 does not turn on, with the result that no voltage undershoot occurs in the vertical signal line 9.

Figure 7:
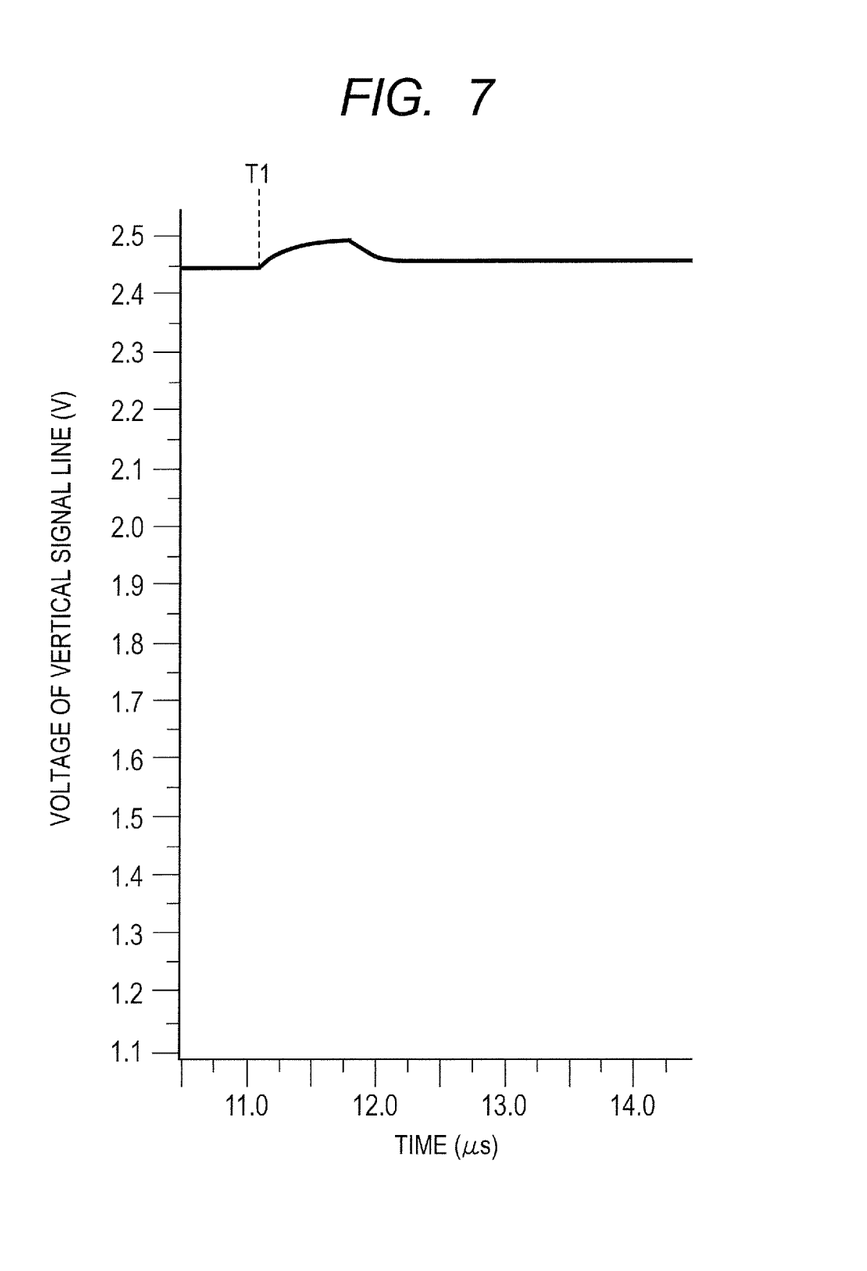
FIG. 7 is a graph of a simulation result showing an effect of the second embodiment of the present invention.

FIG. 7 is a graph of a simulation result of the voltage of the vertical signal line 9 in the circuit according to the second embodiment of the present invention. The waveform in FIG. 7 shows a voltage change at the time when the amount of signal electric charges transferred from the photoelectric conversion element 4 is zero. The time around 11 µs in FIG. 7 corresponds to the time T1 in FIG. 6, that is, the time at which the control signal PT_Dr becomes High level. It is understood that no undershoot occurs at the time T1 unlike the case (a) in the first embodiment. Consequently, this embodiment may obtain the same effect as that in the first embodiment, and further may suppress the occurrence of the voltage undershoot in the vertical signal line 9.

Third Embodiment

Figure 8:
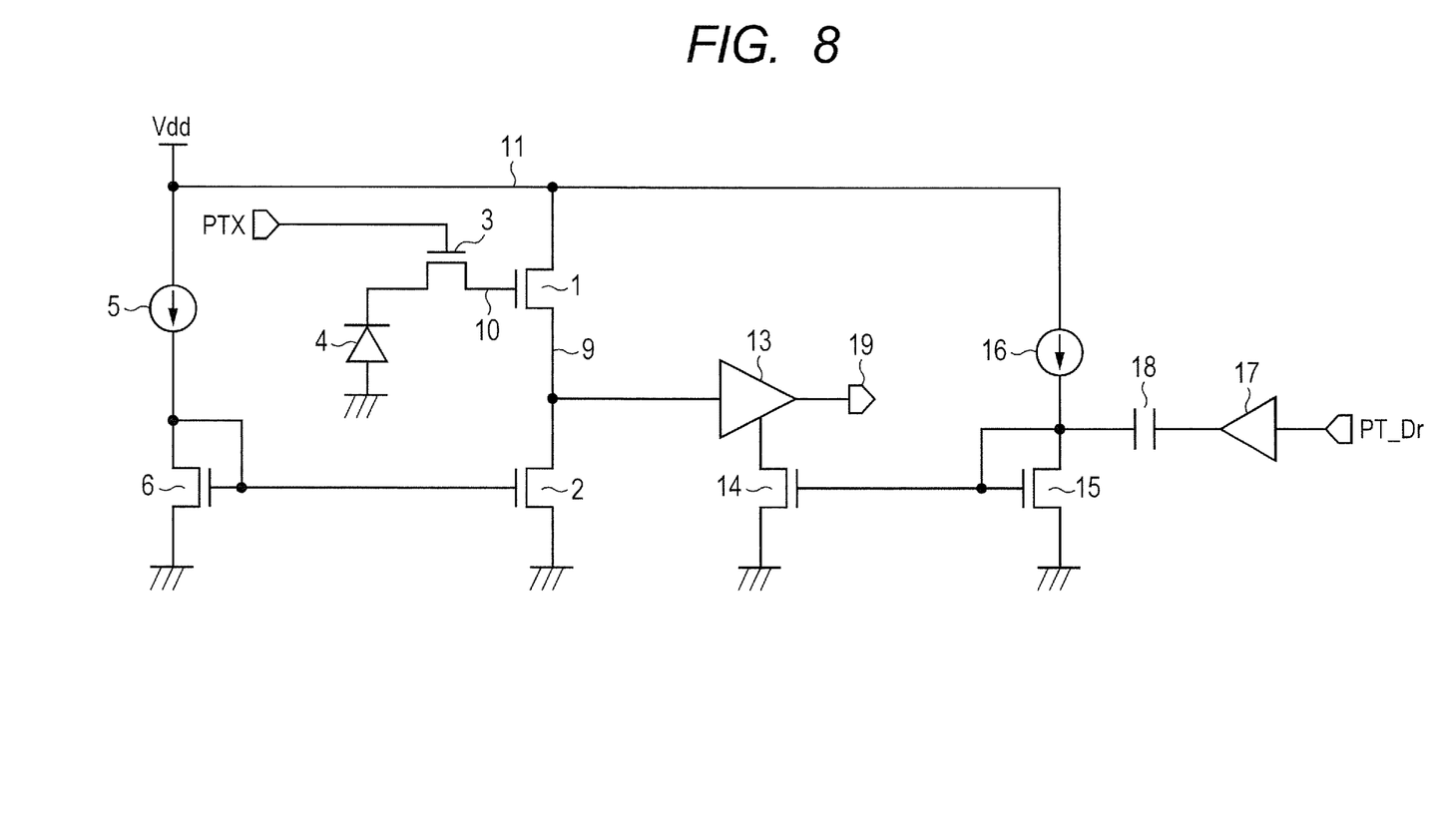
FIG. 8 is a circuit diagram of an imaging apparatus according to a third embodiment of the present invention.

FIG. 8 is a circuit diagram of an imaging apparatus according to a third embodiment of the present invention. The difference from the circuit diagram of the first embodiment illustrated in FIG. 1 resides in that the input capacitor 7 and the voltage driver 8, which are connected to the drain of the current mirror transistor 6, are removed and the same function is realized by using an amplifier 13 connected to the vertical signal line 9 and a control circuit therefor. The imaging apparatus includes, in addition to the configuration of FIG. 1, the amplifier 13, a load transistor 14, a current mirror transistor 15, a current source 16, a voltage driver 17, and an input capacitor 18.

The amplifier 13 is an amplifier configured to amplify an output signal voltage of the amplifier transistor 1 to output the amplified output signal voltage from an output terminal 19. The amplifier 13 is supplied with a bias current from the load transistor 14. A gate of the load transistor 14 is connected to a gate and a drain of the current mirror transistor 15, and the load transistor 14 and the current mirror transistor 15 form a current mirror circuit. The drain of the current mirror transistor 15 is supplied with a current from the power supply interconnect 11 by the current source 16, and the drain is also connected to the voltage driver 17 via the input capacitor 18. The voltage driver 17 amplifies or buffers the input control signal PT_Dr to output the resultant. Similarly to the case of the first embodiment, the input capacitor 18 and an on-resistance of the current mirror transistor 15 form a differentiator circuit, and only a high frequency component of the output of the voltage driver 17 is input to the current mirror transistor 15. Note that, the sources of the load transistor 14 and the current mirror transistor 15 are grounded.

Figure 9:
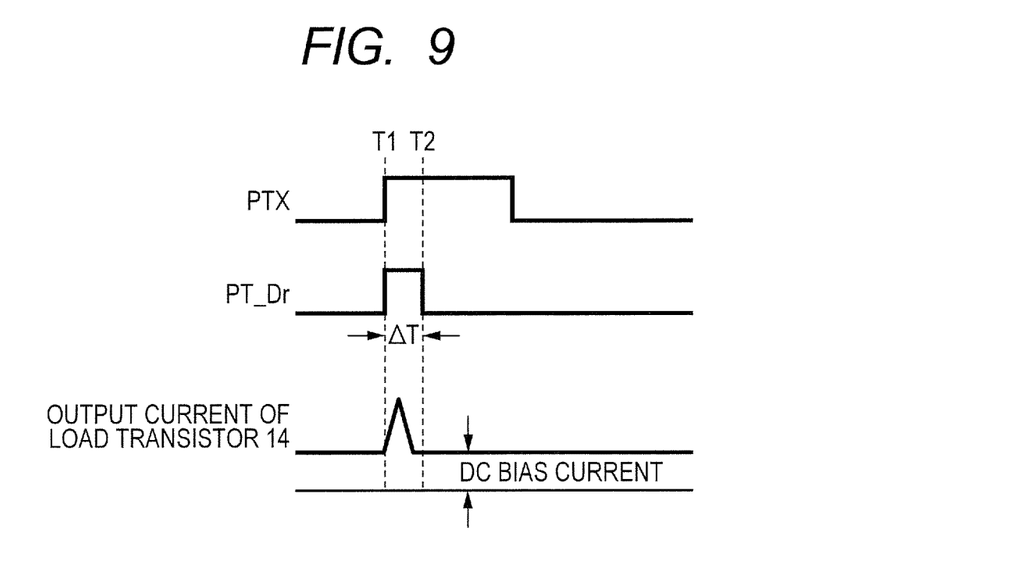
FIG. 9 is a timing chart of the imaging apparatus according to the third embodiment of the present invention.

FIG. 9 is a timing chart illustrating an operation of the imaging apparatus according to the third embodiment of the present invention. The timing chart illustrates a relationship between the control signals PTX and PT_Dr and a current flowing through the load transistor 14. As described above, the input capacitor 18 and the current mirror transistor 15 form the differentiator circuit, and the load transistor 14 and the current mirror transistor 15 form the current mirror circuit. Thus, at the timing at which the value of the control signal PT_Dr changes from Low level to High level, a current having a waveform similar to a triangular wave flows from the load transistor 14. In other periods, a constant DC bias current flows from the load transistor 14. On the other hand, there is a positive correlation between a bias current of an amplifier circuit and the slew rate, and the slew rate becomes higher as the bias current becomes larger. As a result, in the period ΔT from the time T1 at which the control signal PT_Dr becomes High level to the time T2 at which the control signal PT_Dr becomes Low level, the output voltage of the output terminal 19 changes at high speed, and hence the signal voltage may be read at high speed.

Note that, in this embodiment, the current of the amplifier for amplifying the signal is temporarily increased, but for example, the current may be temporarily amplified with use of another means than the amplifier, such as a buffer amplifier. Further, the circuit for amplifying the current by the transistor as exemplified in the second embodiment may be used in combination with this embodiment.

Fourth Embodiment

Figure 10A:
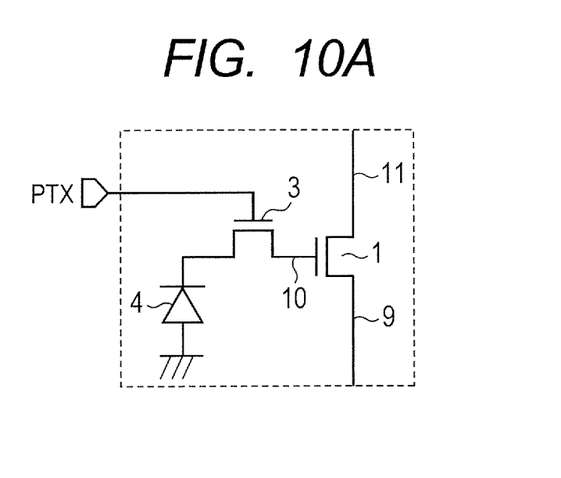
FIG. 10A is a circuit diagram of a one-dimensionally arrayed sensor according to a fourth embodiment of the present invention.
Figure 10B:
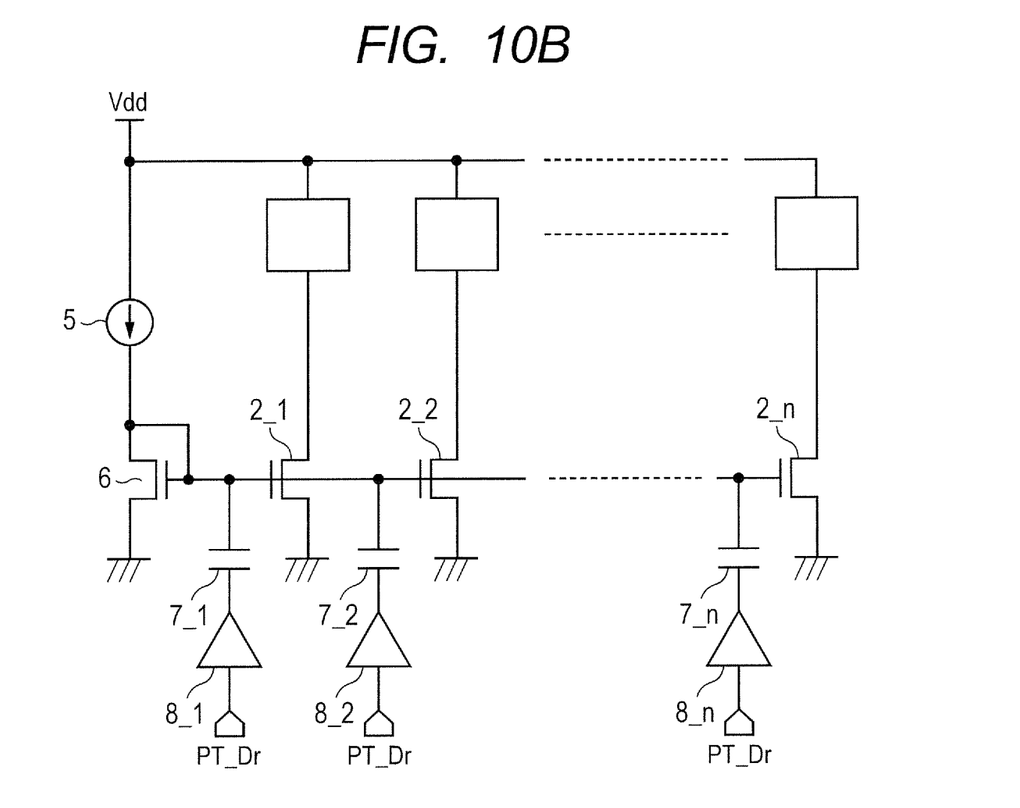
FIG. 10B is a circuit diagram of the one-dimensionally arrayed sensor according to the fourth embodiment of the present invention.
Figure 11A:
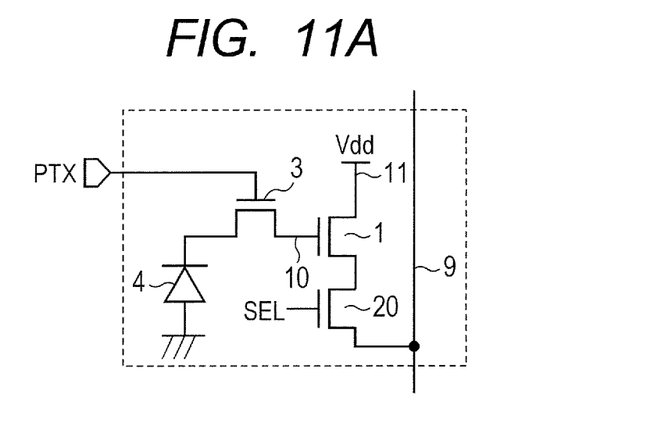
FIG. 11A is a circuit diagram of a two-dimensionally arrayed sensor according to the fourth embodiment of the present invention.
Figure 11B:
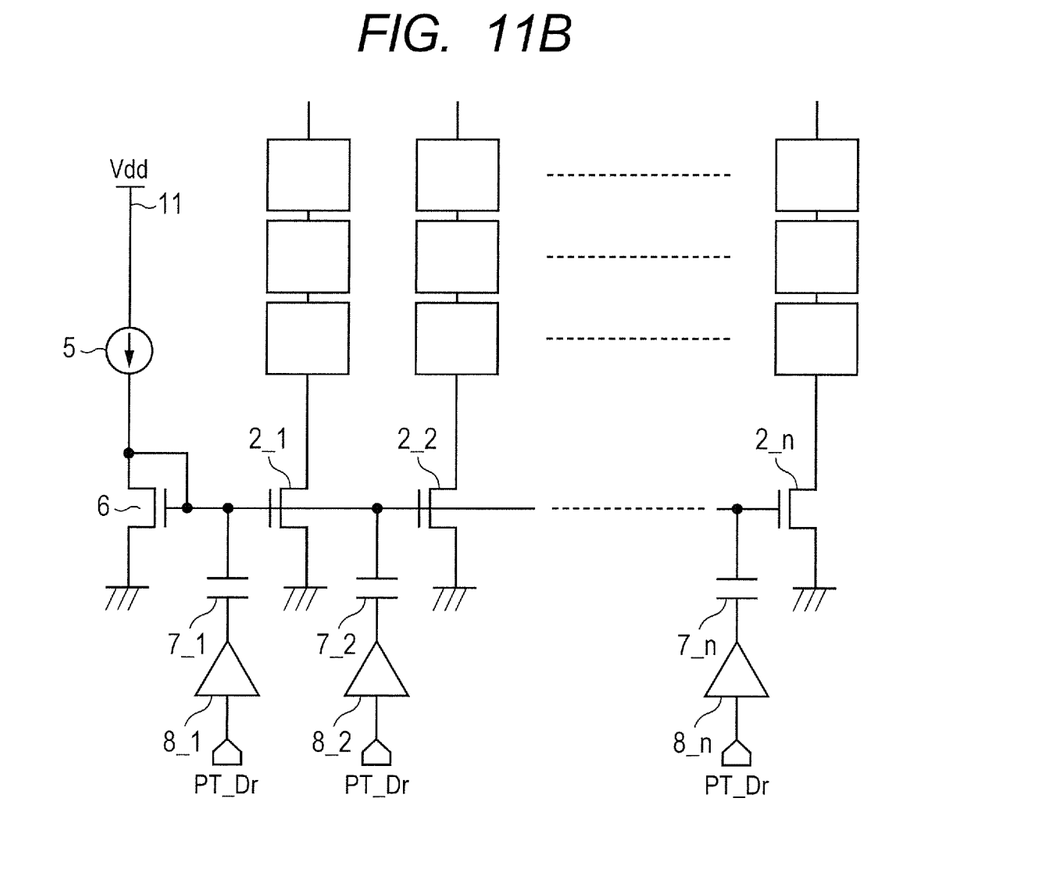
FIG. 11B is a circuit diagram of the two-dimensionally arrayed sensor according to the fourth embodiment of the present invention.

FIGS. 10A and 10B and FIGS. 11A and 11B are circuit diagrams of image sensors according to a fourth embodiment of the present invention. FIGS. 10A and 10B illustrate an embodiment of a one-dimensionally arrayed sensor (line sensor), and FIGS. 11A and 11B illustrate an embodiment of a two-dimensionally arrayed sensor (area sensor).

Referring to FIGS. 10A and 10B, the configurations in this embodiment are described. FIG. 10A illustrates a circuit configuration of the pixel described in the first embodiment, and FIG. 10B illustrates a configuration of a line sensor in which a plurality of the pixels are arranged in line. Load transistors 2_1 to 2_n are arranged for respective lines of the line sensor. The gates of the load transistors 2_1 to 2_n are connected in common to a single current mirror transistor 6 in which the gate and the drain are short-circuited. In addition, the control signal PT_Dr is input to each line from the voltage driver 8 via the input capacitor 7.

In the case where the common gates of the load transistors 2 are collectively controlled by a single voltage driver 8 and a single input capacitor 7, the output signal of the voltage driver 8 is rounded in the course of propagation due to the interconnect resistance of a common line. Accordingly, the peaks in the current waveforms of the load transistors 2_1 to 2_n sit away from the voltage driver 8 are rounded, with the result that the rate of the voltage change in the vertical signal line is decreased so that the readout speed is decreased or the variations in the readout speed among the lines are increased. In this embodiment, the voltage driver 8 is connected to each line via the input capacitor 7, and hence the rounding of the output waveform of the voltage driver 8 may be suppressed to accelerate the reading or reduce the variations in the readout speed among the lines. The input capacitor 7 and the voltage driver 8 may be arranged for every few lines, rather than being arranged for each line. In this case, the number of elements may be reduced while the above-mentioned effect is maintained.

FIGS. 11A and 11B illustrate an embodiment of a two-dimensionally arrayed sensor as a modified example of the above-mentioned one-dimensional sensor. FIG. 11A illustrates a circuit configuration of a pixel, and FIG. 11B illustrates a configuration of an area sensor in which a plurality of the pixels are arranged in matrix. In the two-dimensional sensor, a plurality of pixels are connected to one vertical signal line, and are sequentially driven for each row. Each pixel includes a selection transistor 20 in addition to the configuration of the pixel for the one-dimensional sensor, and signals in a row selected by a control signal SEL are read to the vertical signal line 9. The other points are the same as those in the above-mentioned one-dimensional sensor, and hence descriptions thereof are omitted. In this embodiment, because a plurality of pixels are connected to one vertical signal line, a large parasitic capacitance may be formed. If the parasitic capacitance is large, the circuit time constant determined by the product of resistance and capacitance should be large, and hence the rounding of the output waveform of the voltage driver 8 described above is more conspicuous. Accordingly, the effect of the present invention is higher for the two-dimensional sensor than for the one-dimensional sensor, and it is more preferred to apply the present invention to the two-dimensional sensor. Consequently, the two-dimensional sensor having the reduced readout time may be provided.

Fifth Embodiment

Figure 12:
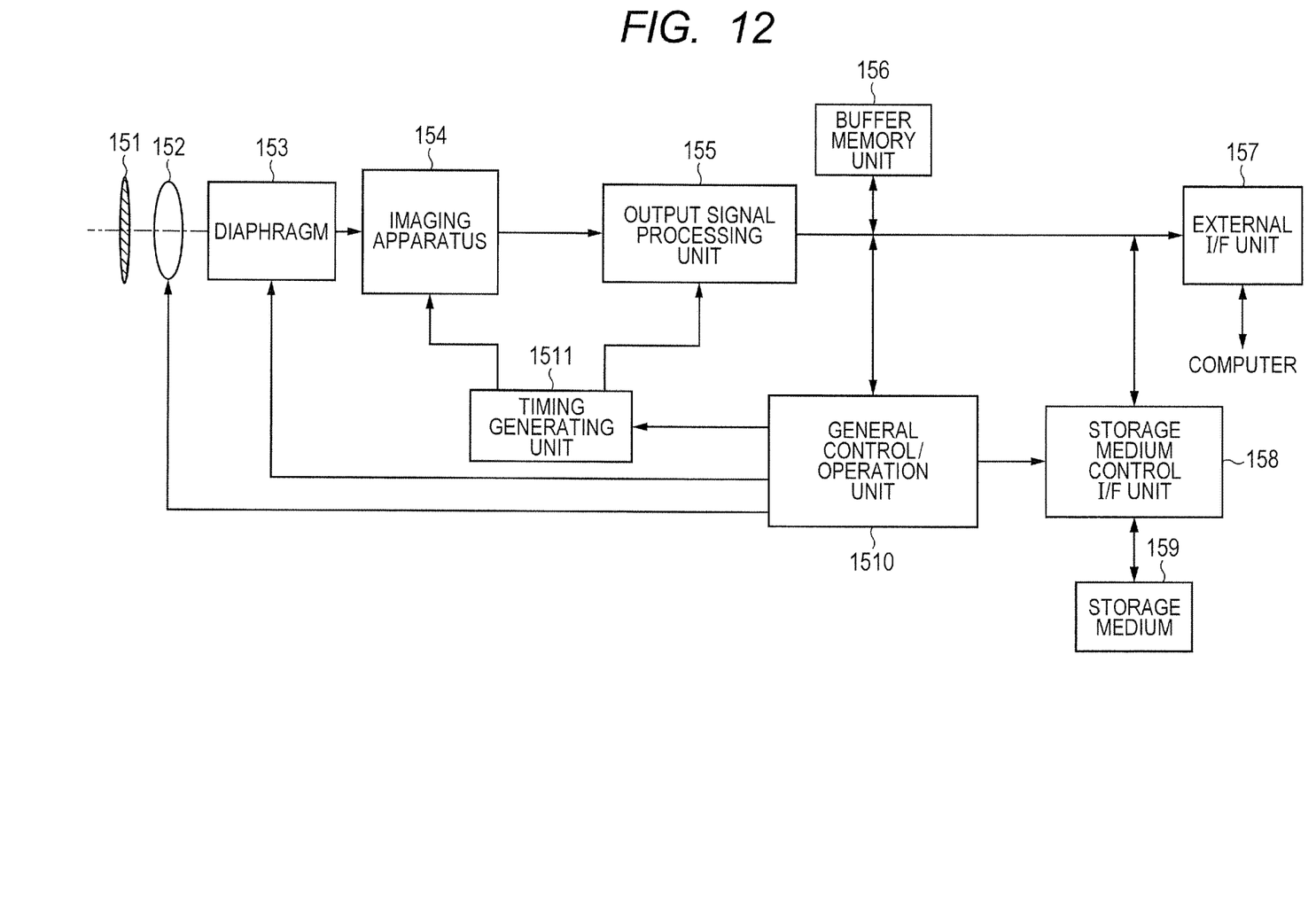
FIG. 12 is a block diagram of an imaging system according to a fifth embodiment of the present invention.

The imaging apparatus described in the above-mentioned first to fourth embodiments are applicable to various kinds of imaging systems. Examples of the imaging system include a digital still camera, a digital camcorder, and a monitoring camera. FIG. 12 is a schematic diagram of a digital still camera as an example of an imaging system to which the imaging apparatus according to any one of the first to fourth embodiments of the present invention is applied.

The imaging system exemplified in FIG. 12 includes an imaging apparatus 154, a barrier 151 for protecting a lens, a lens 152 for forming an optical image of a subject onto the imaging apparatus 154, and a diaphragm 153 for varying the amount of light transmitted through the lens 152. The lens 152 and the diaphragm 153 are an optical system configured to focus light onto the imaging apparatus 154. The imaging system exemplified in FIG. 12 further includes an output signal processing unit 155 configured to process an output signal output from the imaging apparatus 154.

The output signal processing unit 155 performs AD conversion to convert an analog signal output from the imaging apparatus 154 into a digital signal. Further, the output signal processing unit 155 also performs various kinds of correction and compression if necessary, and outputs resultant image data. The imaging system exemplified in FIG. 12 further includes a buffer memory unit 156 for storing the image data temporarily, and an external interface unit (external I/F unit) 157 for communicating to/from an external computer and the like. The imaging system further includes a storage medium 159 such as a semiconductor memory for recording or reading imaging data, and a storage medium control interface unit (storage medium control I/F unit) 158 for recording or reading the imaging data to or from the storage medium 159. Note that, the storage medium 159 may be built in the imaging system, or may be removably mounted thereon.

The imaging system further includes a general control/operation unit 1510 configured to perform various kinds of operations and control the overall digital still camera, and a timing generating unit 1511 configured to output various kinds of timing signals to the imaging apparatus 154 and the output signal processing unit 155. In this case, the timing signals may be input from the outside, and the imaging system only needs to include at least the imaging apparatus 154 and the output signal processing unit 155 configured to process the output signal output from the imaging apparatus 154. As described above, the imaging system according to this embodiment may perform an imaging operation through the application of the imaging apparatus 154.

As described in the first embodiment, it is preferred to operate the imaging system so as to increase the ISO speed value when the brightness of an imaging target is low. In this case, it is preferred that the imaging system control the imaging apparatus 154 so as to set the ISO speed and to increase the period ΔT corresponding to the pulse width of the control signal PT_Dr in accordance with the magnitude of the ISO speed setting value. Further, because the amount of change in output current of the load transistor 2 may be increased as the voltage difference between the outputs of the voltage driver 8 at High level and at Low level becomes larger, it is also preferred to set the voltage difference to be large when the ISO speed setting value is large.

Note that, the embodiments described above may be combined in various combinations.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-096530, filed May 8, 2014, which is hereby incorporated by reference herein in its entirety.

What is claimed is:

1. An imaging apparatus, comprising:
a plurality of pixels each including a photoelectric conversion element and an input transistor configured to receive a signal corresponding to electric charges generated by the photoelectric conversion element;
an output line connected to the plurality of pixels; and
a current source unit including:
    a current source;
    a first transistor having a first control node, a first main node connected to a common node, and a second main node supplied with a predetermined voltage, the common node being a node connected to the current source and the first control node;
    a second transistor having a second control node connected to the common node, a third main node connected to the output line, and a fourth main node supplied with a predetermined voltage; and
    a capacitor having a first node connected to the common node, and a second node supplied with a first voltage and a second voltage different from the first voltage,
wherein the current source unit is configured to supply a bias current having a first current value by supplying the first voltage to the second node, and the bias current having a second current value different from the first current value by supplying the second voltage to the second node.

2. An imaging apparatus according to claim 1, wherein a difference between the first current value and the second current value is controlled based on a signal output from the input transistor.

3. An imaging apparatus according to claim 1, wherein a period during which the bias current has one of the first current value and the second current value is controlled based on a signal output from the input transistor.

4. An imaging apparatus according to claim 1, wherein each of the plurality of pixels includes a transfer transistor configured to transfer the electric charges from the photoelectric conversion element, and
the bias current changes from the first current value to the second current value during a period in which the transfer transistor is on.

5. An imaging system, comprising:
the imaging apparatus of claim 1; and
a signal processing apparatus configured to process a signal output from the imaging apparatus.

6. An imaging apparatus according to claim 1, comprising a plurality of the output lines and a plurality of the second transistors,
wherein the second control node of each of the plurality of second transistors is connected to the common node, and
wherein the third node of each of the plurality of second transistors is connected to a corresponding one of the plurality of output lines.

7. An imaging apparatus according to claim 6, comprising a plurality of the capacitors,
wherein the first node of each of the plurality of capacitors is connected to the common node, and
wherein each of the plurality of capacitors is arranged for a corresponding one of the plurality of output lines.

8. An imaging apparatus according to claim 7, further comprising a plurality of voltage supply units each supplying the first voltage and the second voltage, wherein each of the voltage supply units is arranged for a corresponding one of the plurality of capacitors.

* * * * *